(12) United States Patent
Nakata et al.

(10) Patent No.: US 8,189,083 B2
(45) Date of Patent: May 29, 2012

(54) SOLID-STATE IMAGING DEVICE, METHOD FOR MANUFACTURING THE SAME AND IMAGING APPARATUS

(75) Inventors: Masashi Nakata, Kanagawa (JP);
Haruhiko Ajisawa, Kanagawa (JP);
Naotsugu Yoshida, Kumamoto (JP);
Yasuhiro Nakana, Kumamoto (JP);
Junichi Furukawa, Kanagawa (JP);
Yoshinori Toumiya, Kanagawa (JP);
Junichiro Fujimagari, Kanagawa (JP)

(73) Assignee: Sony Corporation, Tokyo (JP)

( * ) Notice: Subject to any disclaimer, the term of this patent is extended or adjusted under 35 U.S.C. 154(b) by 349 days.

(21) Appl. No.: 12/496,963

(22) Filed: Jul. 2, 2009

(65) Prior Publication Data
US 2010/0007779 A1    Jan. 14, 2010

(30) Foreign Application Priority Data

Jul. 10, 2008  (JP) ................................. 2008-180103
Jun. 10, 2009  (JP) ................................. 2009-138747

(51) Int. Cl.
*H04N 5/335*    (2011.01)
*H01L 31/062*   (2012.01)

(52) U.S. Cl. .......................... 348/294; 348/272; 257/291

(58) Field of Classification Search .................. 348/272, 348/281, 282, 294, 302, 306, 307, 308, 309, 348/310, 311; 257/288, 290, 291; 438/69, 438/70
See application file for complete search history.

(56) References Cited

U.S. PATENT DOCUMENTS

| 7,442,973 | B2 * | 10/2008 | Komoguchi et al. | ......... 257/291 |
| 2006/0166389 | A1 * | 7/2006 | Miyamoto et al. | .............. 438/22 |
| 2006/0220073 | A1 * | 10/2006 | Kooriyama | ................... 257/257 |
| 2007/0145246 | A1 * | 6/2007 | Roy et al. | .................... 250/214.1 |
| 2011/0097838 | A1 * | 4/2011 | Hashimoto | ..................... 438/69 |

FOREIGN PATENT DOCUMENTS

| JP | 2006-332421 | 12/2006 |
| JP | 2008-166677 | 7/2008 |

* cited by examiner

*Primary Examiner* — David Ometz
*Assistant Examiner* — Peter Chon
(74) *Attorney, Agent, or Firm* — SNR Denton US LLP

(57) ABSTRACT

A solid-state imaging device includes a semiconductor substrate having a pixel region including a photoelectric conversion portion, a wiring portion including a conductor line and disposed on the semiconductor substrate with an insulating film therebetween, a metal pad connected to the conductor line, a pad-coating insulating film coating the metal pad, and a waveguide material layer. The wiring portion and the pad-coating insulating film each have an opening therein over the photoelectric conversion portion, and the openings continue from each other to define a waveguide opening having an open side and a closed side. The waveguide material layer is disposed in the waveguide opening and on the pad-coating insulating film with a passivation layer therebetween. The pad-coating insulating film has a thickness of 50 to 250 nm and a face defining the opening. The face is slanted so as to diverge toward the open side of the opening.

8 Claims, 8 Drawing Sheets

SOLID-STATE IMAGING DEVICE, METHOD FOR MANUFACTURING THE SAME AND IMAGING APPARATUS

BACKGROUND OF THE INVENTION

1. Field of the Invention

The present invention relates to a solid-state imaging device, a method for manufacturing the same and an imaging apparatus.

2. Description of the Related Art

A solid-state imaging device of the related art will be described with reference to a schematic sectional view shown in FIG. 8.

As shown in FIG. 8, a photoelectric conversion portion (light-receiving portion) 112 converting incident light into signal charge is formed in a semiconductor substrate 111. The photoelectric conversion portion 112 is covered with an insulating layer 121 including, for example, an antireflection layer and a planarizing layer. The uppermost layer of the insulating layer 121 may be a planarizing layer, and a wiring portion 131 including a plurality of wiring layers and insulating interlayers filling the spaces between the wiring layers and between the conductor lines constituting the wiring layer is formed on the uppermost layer. A conductor line 135 of the wiring portion 131 is connected to a metal pad 137. The metal pad 137 is made of, for example, aluminum or an aluminum alloy.

The metal pad 137 is coated with a pad-coating insulating film 141 on the wiring portion 131.

An optical waveguide 151 is formed in the wiring portion 131 and the pad-coating insulating film 141 over the photoelectric conversion portion 112. The optical waveguide 151 is formed by forming a waveguide material layer 153 in a waveguide opening 133 formed in the insulating interlayers of the wiring portion 131 so as to fill the waveguide opening with a passivation layer 143 therebetween.

A color filter 171 and a condensing lens 181 are further formed on the optical waveguide 151 with a planarizing layer 161 therebetween. Such a structure is proposed in, for example, Japanese Patent Application No. 2006-332421.

The pad-coating insulating film 141 is formed to a thickness of 300 to 500 nm from the viewpoint of process simplicity and mass productivity.

The pad-coating insulating film 141 coats the metal pad 137 to prevent the metal pad 137 from being etched by etching for forming the waveguide opening 133.

Also, the pad-coating insulating film 141 prevents the direct contact of the metal pad 137 with a resist layer used as an etching mask for forming the waveguide opening 133. If the resist comes into contact with the metal pad 137, the metal pad 137 may deteriorate when the resist is reproduced. In particular, an aluminum or aluminum alloy metal pad 137 has a high risk of deterioration.

Therefore, the pad-coating insulating film 141 is preferably provided.

However, the pad-coating insulating film 141 is formed to a large thickness as described above. This increases the aspect ratio of the waveguide opening 133 to extend the entire length of the optical waveguide 151, consequently increasing the optical loss in the optical waveguide 151.

In addition, it may become difficult to fill the waveguide opening 133 with the waveguide material layer 153, and, consequently, voids (not shown) may be formed in the waveguide material layer 153.

A void in the optical waveguide 151 scatters incident light to reduce the quantity of the light reaching the photoelectric conversion portion 112, and thus result in reduced light-receiving sensitivity.

Furthermore, the increase in length of the optical waveguide 151 hinders oblique light from reaching the photoelectric conversion portion 112. Consequently, the sensitivity is reduced at an end of the angle of view, and thus the shading becomes worse.

SUMMARY OF THE INVENTION

Accordingly, it is desirable to solve the problem that the sensitivity is reduced to make the shading worse because the presence of the pad-coating insulating film does not allow the formation of a short optical waveguide.

In an embodiment of the present invention, the thickness of the insulating interlayer or the pad-coating insulating film and the shape of the optical waveguide opening are optimized to enhance the light-receiving sensitivity and to prevent the shading from getting worse.

A solid-state imaging device according to an embodiment of the present invention includes a semiconductor substrate having a pixel region and a peripheral circuit region around the pixel region, a wiring portion including a conductor line and disposed on the semiconductor substrate with an insulating film therebetween, a metal pad connected to the conductor line, a pad-coating insulating film coating the metal pad, and a waveguide material layer. The pixel region includes a photoelectric conversion portion that produces an electrical signal by photoelectric conversion of incident light. The wiring portion and the pad-coating insulating film each have an opening therein over the photoelectric conversion portion, and the openings continue from each other to define a waveguide opening having an open side and a closed side. The waveguide material layer is disposed in the waveguide opening and on the pad-coating insulating film with a passivation layer therebetween. The pad-coating insulating film has a thickness in the range of 50 to 250 nm. The face of the pad-coating insulating film defining the opening is slanted so as to diverge toward the open side of the waveguide opening.

In this solid-state imaging device, the open side of the waveguide opening is defined by a face of the pad-coating insulating film being the uppermost layer of the layers in which the waveguide opening is formed, and the face is slanted so as to diverge toward the open side of the waveguide opening. Accordingly, the passivation layer can be prevented from overhanging the waveguide opening. Thus, the waveguide material layer can favorably fill the waveguide opening without forming a void. Also, the shading can be reduced. More specifically, since the face of the pad-coating insulating film defining the waveguide opening is slanted so as to diverge toward the open side, part of the oblique light, which is generally rejected, can enter the photoelectric conversion portion. Consequently, the quantity of light that the photoelectric conversion portion can receive is increased, and accordingly the sensitivity is enhanced.

In addition, the thickness of the pad-coating insulating film is in the range of 50 to 250 nm, and is thus smaller than that of the pad-coating insulating film according to the related art. Accordingly, the optical path through which incident light reaches the photoelectric conversion portion can be reduced, and the sensitivity can be increased.

Furthermore, the optical waveguide may be formed deeper according to the decrease in thickness of the pad-coating insulating film. Accordingly, the characteristics of the optical waveguide can be improved, and the quantity of light the photoelectric conversion portion can receive can be increased. Consequently, the sensitivity can be increased.

A solid-state imaging device according to another embodiment of the present invention includes a semiconductor substrate having a pixel region and a peripheral circuit region around the pixel region, a wiring portion including a plurality of insulating interlayers having a plurality of conductor lines, and disposed on the semiconductor substrate with an insulating film therebetween, a metal pad disposed on the uppermost insulating interlayer and connected to one of the conductor lines, a pad-coating insulating film coating the metal pad, and a waveguide material layer. The pixel region includes a photoelectric conversion portion that produces an electrical signal by photoelectric conversion of incident light. The wiring portion and the pad-coating insulating film each have an opening therein over the photoelectric conversion portion, and the openings continue from each other to define a waveguide opening having an open side and a closed side. The waveguide material layer is disposed in the waveguide opening and on the pad-coating insulating film with a passivation layer therebetween. The uppermost insulating interlayer has a portion on which the metal pad is disposed and a portion not having the metal pad, and the portion not having the metal pad has a smaller thickness than the portion under the metal pad. The face of the pad-coating insulating film defining the opening is slanted so as to diverge toward the open side of the waveguide opening.

In this solid-state imaging device, the open side of the waveguide opening is defined by a face of the pad-coating insulating film being the uppermost layer of the layers in which the waveguide opening is formed, and the face is slanted toward the open side of the waveguide opening. Accordingly, the passivation layer can be prevented from overhanging the waveguide opening. Thus, the waveguide material layer can favorably fill the waveguide opening without forming a void. Also, the shading can be reduced. More specifically, since the face of the pad-coating insulating film defining part of the waveguide opening is slanted so as to diverge toward the open side, part of the oblique light, which is generally rejected, can enter the photoelectric conversion portion. Consequently, the quantity of light that the photoelectric conversion portion can receive is increased, and accordingly the sensitivity is enhanced.

In addition, the uppermost insulating interlayer has a portion on which the metal pad is disposed and a portion not having the metal pad, and the portion not having the metal pad has a smaller thickness than the portion under the metal pad. Thus, the portion of the wiring portion in which the waveguide is formed has a smaller thickness than the structure according to the related art. Accordingly, the optical path through which incident light reaches the photoelectric conversion portion can be reduced, and consequently, the sensitivity can be increased.

Alternatively, the optical waveguide may be formed deeper according to the decrease in thickness of the pad-coating insulating film. Accordingly, the characteristics of the optical waveguide can be improved, and the quantity of light the photoelectric conversion portion can receive can be increased. Consequently, the sensitivity can be increased.

A solid-state imaging device according to still another embodiment of the present invention includes a semiconductor substrate having a pixel region and a peripheral circuit region around the pixel region, a wiring portion including a plurality of insulating interlayers having a plurality of conductor lines, and disposed on the semiconductor substrate with an insulating film therebetween, a metal pad disposed on the uppermost insulating interlayer and connected to one of the conductor lines, a pad-coating insulating film coating the metal pad, and a waveguide material layer. The pixel region includes a photoelectric conversion portion that produces an electrical signal by photoelectric conversion of incident light. The wiring portion and the pad-coating insulating film each have an opening therein over the photoelectric conversion portion, and the openings continue from each other to define a waveguide opening having an open side and a closed side. The waveguide material layer is disposed in the waveguide opening and on the pad-coating insulating film with a passivation layer therebetween. The uppermost insulating interlayer is present only under the metal pad. The face of the pad-coating insulating film defining the opening is slanted so as to diverge toward the open side of the waveguide opening.

In this solid-state imaging device, the open side of the waveguide opening is defined by a face of the pad-coating insulating film being the uppermost layer of the layers in which the waveguide opening is formed, and the face is slanted toward the open side of the waveguide opening. Accordingly, the passivation layer can be prevented from overhanging the waveguide opening. Thus, the waveguide material layer can favorably fill the waveguide opening without forming a void. Also, the shading can be reduced. More specifically, since the face of the pad-coating insulating film defining part of the waveguide opening is slanted so as to diverge toward the open side, part of the oblique light, which is generally rejected, can enter the photoelectric conversion portion. Consequently, the quantity of light that the photoelectric conversion portion can receive is increased, and accordingly the sensitivity is enhanced.

Also, since the uppermost insulating interlayer is present only under the metal pad, the total thickness of the insulating interlayers in the region in which the waveguide opening is formed can be smaller than that according to the rerated art. Accordingly, the optical path through which incident light reaches the photoelectric conversion portion can be reduced, and consequently, the sensitivity can be increased.

Alternatively, the optical waveguide may be formed deeper according to the decrease in thickness of the pad-coating insulating film. Accordingly, the characteristics of the optical waveguide can be improved, and the quantity of light the photoelectric conversion portion can receive can be increased. Consequently, the sensitivity can be increased.

A method for manufacturing a solid-state imaging device according to an embodiment of the present invention includes the steps of: forming in a semiconductor substrate a pixel region that includes a photoelectric conversion portion producing an electrical signal by photoelectric conversion of incident light and a peripheral circuit portion around the pixel region; forming a wiring portion including a plurality of insulating interlayers having a plurality of conductor lines, on the semiconductor substrate with an insulating film therebetween; forming a metal pad connected to one of the plurality of conductor lines on the uppermost layer of the insulating interlayers of the wiring portion; forming a pad-coating insulating film coating the metal pad on the wiring portion; and forming a waveguide opening having an open side and a closed side in the insulating interlayers and the pad-coating insulating film over the photoelectric conversion portion such that the opening in the pad-coating insulating film has a face slated so as to diverge toward the open side of the waveguide opening. The step of forming the metal pad includes the sub steps of forming a connection hole in the uppermost layer of the insulating interlayers so as to communicate with one of the conductor lines under the uppermost insulating interlayer, forming a metal-based electroconductive layer on the uppermost insulating interlayer so as to fill the connection hole, patterning the electroconductive layer to form a plug in the connection hole and the metal pad connected to the plug, and etching the uppermost insulating interlayer so as to reduce the thickness of the uppermost insulating interlayer around the metal pad or removing the uppermost insulating interlayer around the metal pad, leaving the portion of the uppermost insulating interlayer under the metal pad.

When the waveguide opening is formed in a method for manufacturing a solid-state imaging device according to an embodiment, the face of the pad-coating insulating film defining part of the waveguide opening is slanted so as to diverge toward the open side. Thus, the passivation layer is prevented from overhanging the waveguide opening. Consequently, the waveguide material layer can favorably fill the waveguide opening without forming voids. Also, since the face of the pad-coating insulating film defining part of the waveguide opening is slanted so as to diverge toward the open side, part of the oblique light, which is generally rejected, can enter the photoelectric conversion portion. Thus, the quantity of light the photoelectric conversion portion can receive is increased as well as the shading is reduced, and accordingly the sensitivity is enhanced.

The uppermost insulating interlayer is etched so as to reduce the thickness of the uppermost insulating interlayer around the metal pad or substantially completely removing the uppermost insulating interlayer around the metal pad, leaving the portion of the uppermost insulating interlayer under the metal pad. Thus, the optical path through which incident light reaches the photoelectric conversion portion can be reduced, and consequently, the sensitivity can be increased.

Alternatively, the optical waveguide may be formed deeper according to the decrease in thickness of the uppermost insulating interlayer. Accordingly, the characteristics of the optical waveguide can be improved, and the quantity of light the photoelectric conversion portion can receive can be increased. Consequently, the sensitivity can be increased.

An imaging apparatus according to an embodiment of the present invention includes a light-focusing optical section focusing incident light, an imaging section including a solid-state imaging device, receiving the light focused in the light-focusing optical section and photoelectrically converting the light into a signal, and a signal processing section processing the signal converted in the imaging section. The solid-state imaging device includes a semiconductor substrate having a pixel region and a peripheral circuit region around the pixel region, a wiring portion including a conductor line and disposed on the semiconductor substrate with an insulating film therebetween, a metal pad connected to the conductor line, a pad-coating insulating film coating the metal pad, and a waveguide material layer. The pixel region includes a photoelectric conversion portion that produces an electrical signal by photoelectric conversion of incident light. The wiring portion and the pad-coating insulating film each have an opening therein over the photoelectric conversion portion, and the openings continue from each other to define a waveguide opening having an open side and a closed side. The waveguide material layer is disposed in the waveguide opening and on the pad-coating insulating film with a passivation layer therebetween. The pad-coating insulating film has a thickness in the range of 50 to 250 nm and a face defining the opening therein. The face is slanted so as to diverge toward the open side of the waveguide opening.

Since the imaging apparatus uses the solid-state imaging device according to an embodiment of the invention, the sensitivity of the photoelectric conversion portion of each pixel is enhanced, and the shading is reduced.

In the solid-state imaging device according to an embodiment of the invention, the quantity of light the photoelectric conversion portion can receive is increased. Accordingly, the sensitivity is enhanced, and the shading is reduced.

The imaging apparatus includes the solid-state imaging device according to an embodiment of the invention, and thus ensures a sufficient sensitivity in the photoelectric conversion portion of each pixel. Consequently, pixel properties, for example, sensitivity, can be advantageously enhanced. In addition, the shading can be reduced, and accordingly, the resolution is increased around the pixels. Thus, the image quality can be enhanced.

DESCRIPTION OF THE PREFERRED EMBODIMENTS

Preferred embodiments of the invention will now be described.
First Embodiment
Solid-State Imaging Device A solid-state imaging device according to a first embodiment of the present invention will now be described with reference to the schematic sectional view shown in FIG. 1.

Figure 1:
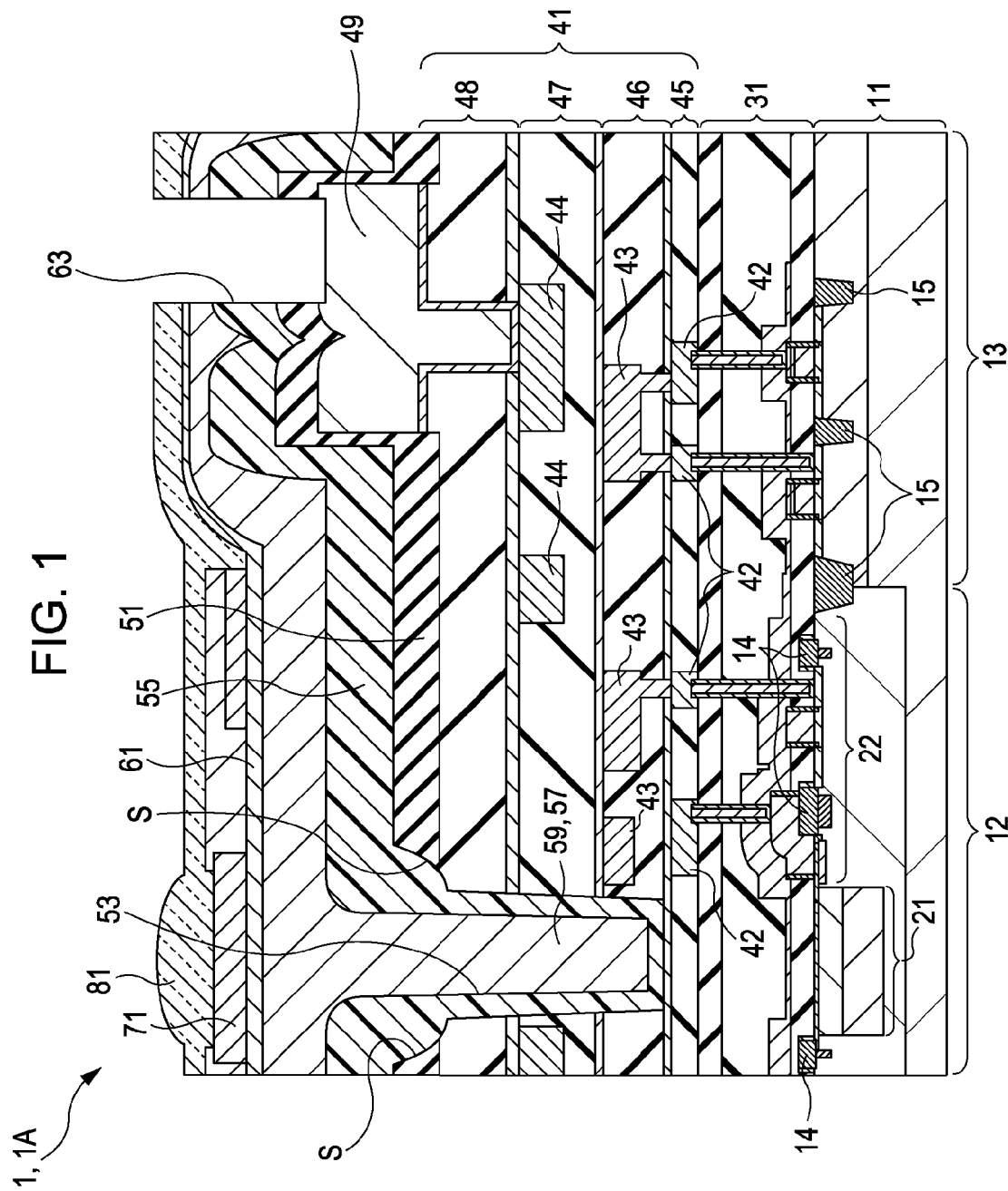
FIG. 1 is a schematic sectional view of a solid-state imaging device according to an embodiment of the present invention.

As shown in FIG. 1, a semiconductor substrate 11 has a pixel region 12 and a peripheral circuit region 13 around the pixel region 12. The pixel region 12 includes a photoelectric conversion portion 21 that produces electrical signals by photoelectrically converting incident light.

In addition to the photoelectric conversion portion 21, the pixel region 12 includes a pixel transistor portion 22 converting the signal charge read from the photoelectric conversion portion 21 into a voltage, and a first isolation portion 14 separating the photoelectric conversion portion 21 from the pixel transistor portion 22. The first isolation portion 14 has an STI (Shallow Trench Isolation) structure and protrudes from the surface of the semiconductor substrate 11.

A second isolation portion 15 having an STI structure is also provided to the peripheral circuit region 13 of the semiconductor substrate 11.

The portion of the first isolation portion 14 buried in the semiconductor substrate 11 has a smaller depth than the portion of the second isolation portion 15 buried in the semiconductor substrate 11. For example, part of the first isolation portion 14 is buried in the semiconductor substrate 11 to a depth in the range of 50 to 160 nm. Part of the second isolation portion 15 is buried in the semiconductor substrate 11 to a depth in the range of, for example, 200 to 300 nm.

By reducing the depth of the buried portion of the first isolation portion 14 in the pixel region 12, etching damage to and film stress on the STI structure can be reduced. By setting the depth of the buried portion in the above range, white spots and dark current can be reduced, which is important to the imaging characteristics of the pixel region 12.

In addition, by burying the second isolation portion 15 of the peripheral circuit region 13 deeper than the first isolation portion 14, the isolation withstand voltage can be increased. One of the important factors for the peripheral circuit region 13 is high-speed operation. By increasing the depth of the buried portion, the parasitic capacitance of the conductor line can be reduced, and consequently, a high-speed device can be achieved.

Thus, the depth of the STI structure can be varied between the pixel region 12 and the peripheral circuit region 13 to achieve a high-performance solid-state imaging device 1 (1A).

The semiconductor substrate 11 is covered with an insulating layer 31 including, for example, an antireflection layer and a planarizing layer. The uppermost layer of the insulating layer 31 may be a planarizing layer, and a wiring portion 41 is formed on the uppermost layer. The wiring portion 41 includes a plurality of wiring layers defined by respective conductor lines 42, 43 and 44, and insulating interlayers 45, 46, 47 and 48 filling the spaces between the wiring layers and between the conductor lines. A conductor line 44 of the wiring portion 41 is connected to a metal pad 49. The metal pad 49 is made of, for example, aluminum or an aluminum alloy.

The metal pad 49 is coated with a pad-coating insulating film 51 on the wiring portion 41. The pad-coating insulating film 51 is made of, for example, silicon oxide. Alternatively, the pad-coating insulating film 51 may be a composite film including at least two layers made of silicon oxide, silicon oxynitride or silicon nitride.

A waveguide opening 53 is formed in the insulating interlayers 45, 46, 47 and 48 and the pad-coating insulating film 51, over the photoelectric conversion portion 21.

A waveguide material layer 57 is formed in the waveguide opening 53 and on the pad-coating insulating film 51 with a passivation layer 55 therebetween.

The pad-coating insulating film 51 has a thickness in the range of 50 to 250 nm, and the face S of the pad-coating insulating film 51 defining part of the waveguide opening 53 is slanted so as to diverge toward the open side.

An optical waveguide 59 is thus formed by filling the waveguide-opening 53 with the waveguide material layer 57 with the passivation layer 55 therebetween.

A color filter 71 and a condensing lens 81 are further formed on the optical waveguide 59 with a planarizing layer 61 therebetween. In addition, an opening 63 is formed in a region on the metal pad 49.

The thickness of the pad-coating insulating film 51 will now be described. The pad-coating insulating film 51 is formed to a thickness of 50 to 250 nm from the viewpoint of, for example, the light-receiving sensitivity and the shading property.

The thickness of the pad-coating insulating film 51 is determined as below.

As described above, the face S of the pad-coating insulating film 51 defining the upper portion of the waveguide opening 53 is slanted so as to diverge toward the open side.

Such a slant face is important to sufficiently fill the waveguide opening with a waveguide material. If the thickness of the pad-coating insulating film 51 is less than 50 nm, it is difficult to etch the pad-coating insulating film 51 to form the slant face.

A pad-coating insulating film 51 having a thickness of at least 50 nm can sufficiently protect the metal pad 49 from etching for forming the waveguide opening 53. Also, such a thickness of the pad-coating insulating film 51 allows the pad-coating insulating film 51 to protect the metal pad 49 from resist reproduction. In particular, the thickness of the pad-coating insulating film 51 tends to be smaller on the side surfaces of the metal pad 49 than on the other region because of the feature of deposition.

Therefore, the thickness of the pad-coating insulating film 51 is set to 50 nm or more.

If the passivation layer 55 is directly formed on metal pads 49 formed at a small pitch, voids may be formed undesirably. For example, the spaces between 500 nm thick metal pads 49 formed at intervals of 250 nm have a high aspect ratio. If the passivation layer 55 is directly formed on such metal pads, a void can occur undesirably.

Accordingly, the pad-coating insulating film 51 is formed of a material capable of more easily filling spaces than the material of the passivation layer 55 between the passivation layer 55 and the metal pads 49, thus reducing the aspect ratio at the sides of the metal pads 49. Thus, the occurrence of voids is reduced to increase the reliability.

Preferably, the pad-coating insulating film 51 has a thickness as small as possible from the viewpoint of enhancing the sensitivity of the photoelectric conversion portion 21 and reducing the shading. However, the pad-coating insulating film 51 has an important function as described above.

Accordingly, the upper limit of the thickness of the pad-coating insulating film 51 is set at 250 nm. It is believed that the pad-coating insulating film having such a thickness can enhance the sensitivity of the photoelectric conversion portion 21 and reduce the shading.

In the solid-state imaging device 1 (1A), the face S of the pad-coating insulating film 51 defining part of the waveguide opening 53 is slanted so as to diverge toward the open side. Accordingly, the passivation layer 55 can be prevented from overhanging the waveguide opening 53.

Thus, the waveguide material layer 57 can favorably fill the waveguide opening 53 without forming voids.

Also, the shading can be reduced. More specifically, since the face S of the pad-coating insulating film 51 defining part of the waveguide opening 53 is slanted so as to diverge toward the open side, oblique light, which is generally rejected, can partially enter the photoelectric conversion portion 21.

Consequently, the quantity of light the photoelectric conversion portion 21 can receive is increased, and accordingly the sensitivity is enhanced.

In addition, the thickness of the pad-coating insulating film 51 is in the range of 50 to 250 nm, and is thus smaller than that of the pad-coating insulating film according to the related art.

Accordingly, the optical path through which incident light reaches the photoelectric conversion portion 21 can be reduced, and consequently, the sensitivity can be enhanced.

Alternatively, the optical waveguide 59 may be formed deeper according to the decrease in thickness of the pad-coating insulating film 51.

Accordingly, the characteristics of the optical waveguide are improved, and thus the quantity of light the photoelectric conversion portion 21 can receive is increased. Consequently, the sensitivity can be increased.

Furthermore, the presence of the pad-coating insulating film 51 allows a resist layer acting as an etching mask for forming the waveguide opening 53 to be formed thin. For example, the resist layer can be formed to a thickness of 1.5 µm or less.

Thus, the exposure margin can be increased.

Also, since the metal pad 49 is protected by the resist layer and the pad-coating insulating film 51 from etching for forming the waveguide opening 53, the metal pad 49 is not etched or deteriorated.

Thus, the reliability of the metal pad 49 can be maintained.

The first isolation portion 14 of the pixel region 12 protrudes from the surface of the semiconductor substrate 11. This causes a bump at the surface of the insulating film 31 including an antireflection layer and a planarizing layer overlying the first isolation portion 14. The bump can remain several tens of nanometers even if it is planarized by CMP.

The remaining bump affects the overlying wiring portion 41.

Consequently, it becomes difficult to form the waveguide opening 53. In general, lithography and etching becomes difficult as the height of the bump is increased. Hence, it becomes difficult to form a fine opening.

Accordingly, the lower portion of the first isolation portion 14 is buried in the semiconductor substrate 11 to reduce the height of the first isolation portion 14 protruding from the surface of the semiconductor substrate 11. For example, the height of the protrusion is reduced to 40 nm or less to minimize the negative effect of the bump.

Consequently, the flatness at the surface of the insulating film 31 is enhanced.

By forming the pad-coating insulating film 51 on the surface of the insulating film 31 whose flatness is thus enhanced, the aspect ratio of the waveguide opening 53 can further be reduced, and consequently, the sensitivity of the resulting solid-state imaging device 1 can further be enhanced.

Even if the protrusion of the first isolation portion 14 is larger than the above-mentioned value, the waveguide opening 53 can be easily formed by reducing the thickness of the pad-coating insulating film 51. Hence, the margin for filling the waveguide opening 53 can be increased.

Figure 2:
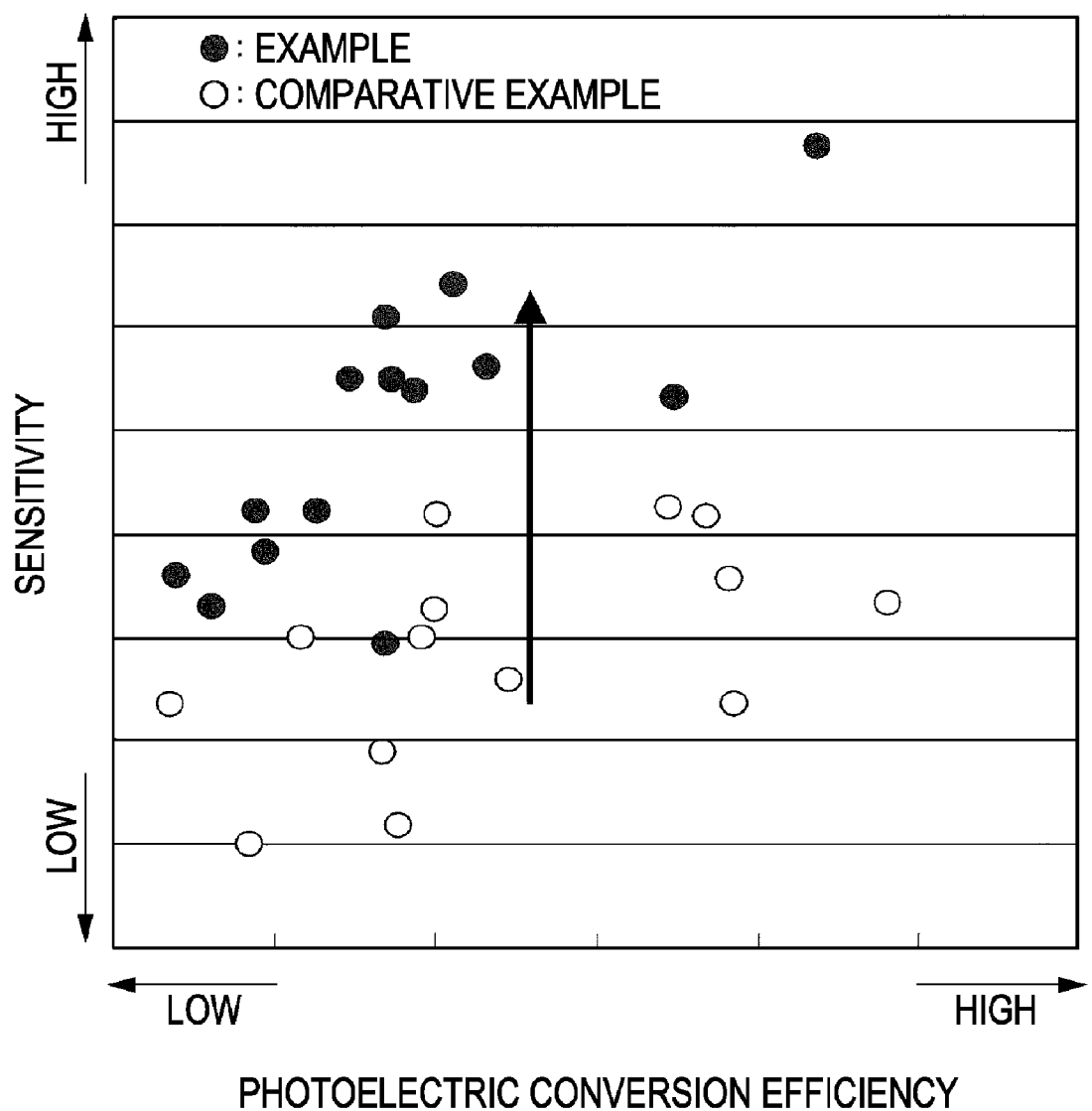
FIG. 2 is a plot showing the relationship between the sensitivity and the photoelectric conversion efficiency.
Figure 3:
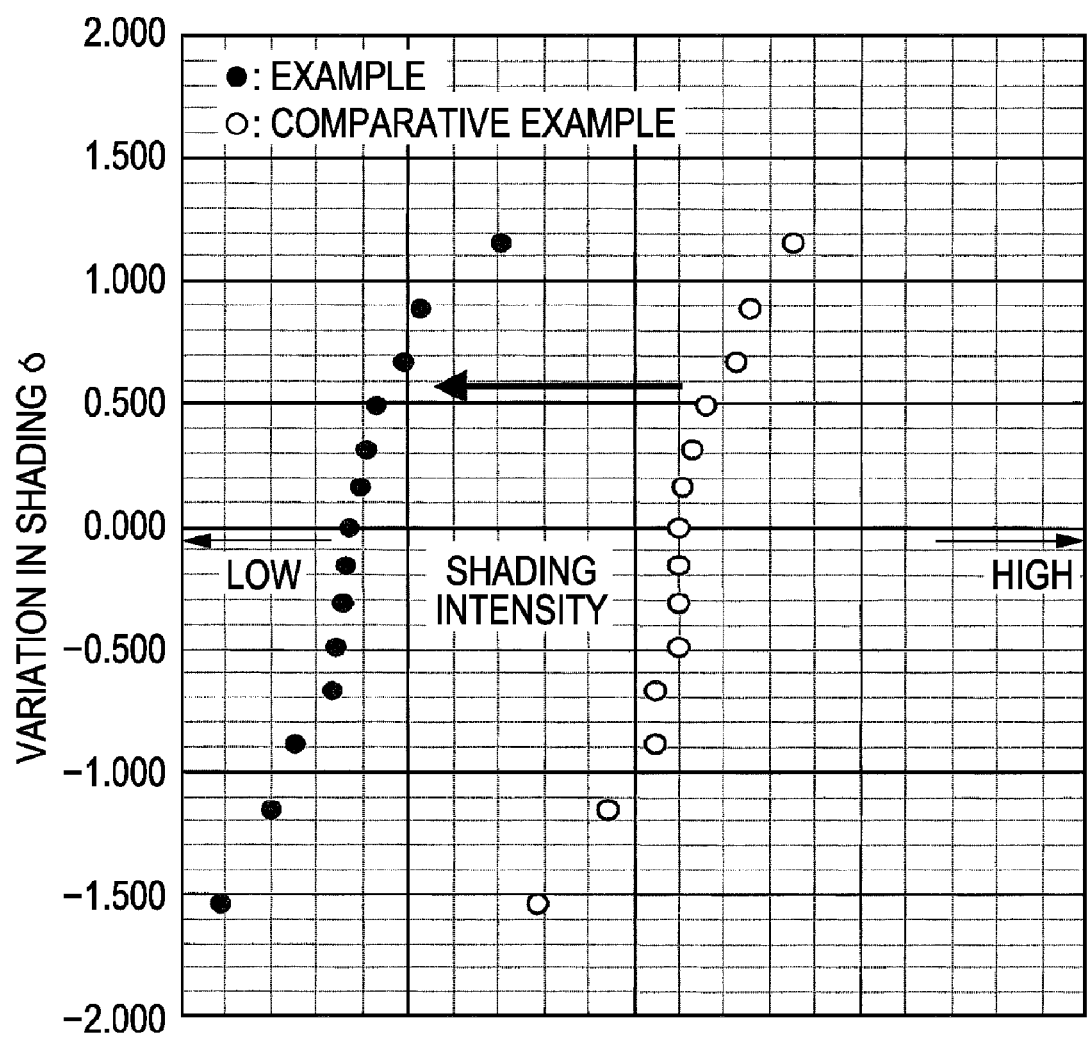
FIG. 3 is a plot showing the relationship between the variation in shading and the shading intensity.

The sensitivity and the shading of an example of the solid-state imaging device 1 (1A) were examined for imaging properties. The results are shown in FIGS. 2 and 3. In FIG. 2, the vertical axis represents the sensitivity and the horizontal axis represents the photoelectric conversion efficiency. In FIG. 3, the vertical axis represents the variation in shading and the horizontal axis represents the shading intensity. The shading intensity shows how much the region where sensitivity is degraded is with respect to the center of the angle of view. A higher shading intensity leads to a degraded sensitivity around the pixel.

The solid-state imaging device 1 (1A) of the Example whose results are shown in FIGS. 2 and 3 included a pad-coating insulating film 51 having a thickness in the range of 50 to 250 nm. A solid-state imaging device according to the related art was also examined as a comparative example. The solid-state imaging device of the comparative example included a pad-coating insulating film 51 having a thickness in the range of 300 to 500 nm.

FIG. 2 shows that the sensitivity of the solid-state imaging device of the Example including the pad-coating insulating film 51 having a reduced thickness was about 2% increased in comparison with the solid-state imaging device of the comparative example.

FIG. 3 shows that the shading of the solid-state imaging device of the example including the pad-coating insulating film 51 having a reduced thickness was about 3% reduced in comparison with the solid-state imaging device of the comparative example.

Since in the solid-state imaging device 1 (1A), the quantity of light the photoelectric conversion portion 21 can receive is increased, the sensitivity is enhanced and the shading is reduced.

Second Embodiment

Solid-State Imaging Device

A solid-state imaging device according to a second embodiment of the present invention will now be described with reference to the schematic sectional view shown in FIG. 4.

Figure 4:
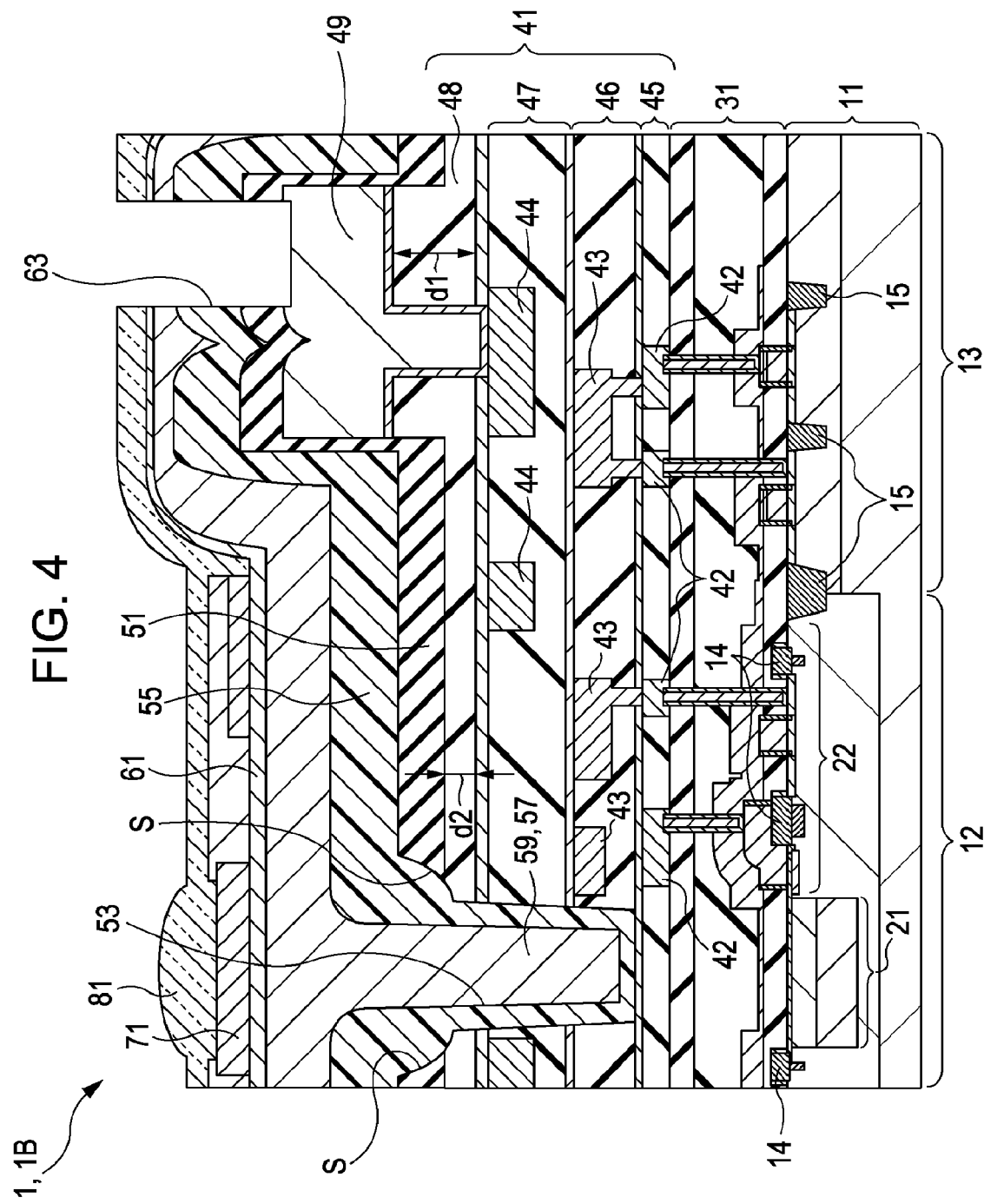
FIG. 4 is a schematic sectional view of a solid-state imaging device according to another embodiment of the present invention.

As shown in FIG. 4, a semiconductor substrate 11 has a pixel region 12 and a peripheral circuit region 13 around the pixel region 12. The pixel region 12 includes a photoelectric conversion portion 21 that produces electrical signals by photoelectric conversion of incident light.

In addition to the photoelectric conversion portion 21, the pixel region 12 includes a pixel transistor portion 22 converting the signal charge read from the photoelectric conversion portion 21 into a voltage, and a first isolation portion 14 separating the photoelectric conversion portion 21 from the pixel transistor portion 22. The first isolation portion 14 has an STI (Shallow Trench Isolation) structure and protrudes from the surface of the semiconductor substrate 11.

A second isolation portion 15 having an STI structure is also provided to the peripheral circuit region 13 of the semiconductor substrate 11.

The portion of the first isolation portion 14 buried in the semiconductor substrate 11 has a smaller depth than the portion of the second isolation portion 15 buried in the semiconductor substrate 11. For example, part of the first isolation portion 14 is buried in the semiconductor substrate 11 to a depth in the range of 50 to 160 nm. Part of the second isolation portion 15 is buried in the semiconductor substrate 11 to a depth in the range of, for example, 200 to 300 nm.

By reducing the depth of the buried portion of the first isolation portion 14 in the pixel region 12, etching damage to and film stress on the STI structure can be reduced. By setting the depth of the buried portion in the above range, white spots and dark current can be reduced, which is important to the imaging characteristics of the pixel region 12.

In addition, by burying the second isolation portion 15 of the peripheral circuit region 13 deeper than the first isolation portion 14, the isolation withstand voltage can be increased. One of the important factors for the peripheral circuit region 13 is high-speed operation. By increasing the depth of the buried portion, the parasitic capacitance of the conductor line can be reduced, and consequently, a high-speed device can be achieved.

Thus, the depth of the STI structure can be varied between the pixel region 12 and the peripheral circuit region 13 to achieve a high-performance solid-state imaging device 1 (1B).

The semiconductor substrate 11 is covered with an insulating layer 31 including, for example, an antireflection layer and a planarizing layer. The uppermost layer of the insulating layer 31 may be a planarizing layer, and a wiring portion 41 is formed on the uppermost layer. The wiring portion 41 includes a plurality of wiring layers defined by respective conductor lines 42, 43 and 44, and insulating interlayers 45, 46, 47 and 48 filling the spaces between the wiring layers and between the conductor lines. The metal pad 49 is formed on the insulating interlayer 48, which is the uppermost layer of the insulating interlayers 45, 46, 47 and 48, and is connected to the conductor line 44. The metal pad 49 is made of, for example, aluminum or an aluminum alloy, and has a thickness in the range of, for example, 600 to 1120 nm, and more preferably 600 to 650 nm.

If the metal layer of the metal pad 49 is intended for only a metal pad, it is advantageous to form the meta pad 49 to a larger thickness, for example, 1120 nm.

In the present embodiment, however, the metal layer of the metal pad 49 also serves as a wiring layer. Since the bonding resistance increases as the thickness is increased, the metal pad 49 can be formed to a thickness of 600 nm or more. On the other hand, from the viewpoint of reducing the step height that may cause other layers, such as color filters, to be formed unevenly, it is advantageous that the metal pad 49 is formed to a thickness of 650 nm or less.

The portion of the uppermost insulating interlayer 48 not having the metal pad 49 has a thickness d2 smaller than the thickness d1 of the portion of the insulating interlayer 48 under the metal pad 49.

For example, the portion of the uppermost insulating interlayer 48 under the metal pad 49 has a thickness d1 of 550 to 600 nm. The thickness d2 of the portion not having the metal pad 49 is 350 nm or less. Alternatively, the uppermost insulating interlayer 48 may not be formed in the region on which the metal pad 49 is not formed.

The thickness d1 of the uppermost insulating interlayer 48 under the metal pad 49 was studied. For example, endurance tests were repeatedly conducted with a needle in contact with the metal pad 49. When the portion of the uppermost insulating interlayer 48 under the metal pad 49 has a thickness d1 of 350 nm, the durability was reduced to half of the durability of the uppermost insulating interlayer having a thickness d1 of 450 or 550 nm. On the other hand, the insulating interlayers having thicknesses d1 of 450 and 550 nm respectively exhibited the same durability.

The uppermost insulating interlayers 48 having thicknesses d1 of 450 and 550 nm were subjected to structural analysis, and it was not found that cracks occurred in the insulating interlayers. It was however observed that leakage current was generated in the sample having a thickness d1 of 450 nm.

This result shows that the thickness d1 of the uppermost insulating interlayer 48 under the metal pad 49 can be 550 nm or more. However, an excessively large thickness d1 may result in a reduced coverage of a layer covering the metal pad 49. Accordingly, the upper limit of the thickness d1 is 1120 nm. The upper limit of the thickness d1 however may be varied depending on the thickness of the metal pad 49. More specifically, the upper limit of the thickness d1 of the uppermost insulating interlayer 48 under the metal pad 49 is set so that the metal pad 49 can be covered with a below-described pad-coating insulating film 51 and passivation layer 55.

The metal pad 49 is coated with a pad-coating insulating film 51 on the wiring portion 41. The pad-coating insulating film 51 is made of, for example, silicon oxide. Alternatively, the pad-coating insulating film 51 may be a composite film including at least two layers made of silicon oxide, silicon oxynitride or silicon nitride.

A waveguide opening 53 is formed in the insulating interlayers 45, 46, 47 and 48 and the pad-coating insulating film 51, over the photoelectric conversion portion 21.

A waveguide material layer 57 is formed in the waveguide opening 53 and on the pad-coating insulating film 51 with a passivation layer 55 therebetween.

The pad-coating insulating film 51 has a thickness in the range of 50 to 250 nm, and the face S of the pad-coating insulating film 51 defining part of the waveguide opening 53 is slanted so as to diverge toward the open side.

An optical waveguide 59 is thus formed by filling the waveguide-opening 53 with the waveguide material layer 57 with the passivation layer 55 therebetween.

A color filter 71 and a condensing lens 81 are further formed on the optical waveguide 59 with a planarizing layer 61 therebetween. In addition, an opening 63 is formed in a region on the metal pad 49.

The pad-coating insulating film 51 is formed to a thickness of 50 to 250 nm from the viewpoint of the light-receiving sensitivity and the shading property, as described above.

In the solid-state imaging device 1 (1B) according to the second embodiment, the face S of the pad-coating insulating film 51 defining part of the waveguide opening 53 is slanted so as to diverge toward the open side in the same manner as in the solid-state imaging device 1 (1A) of the first embodiment. Accordingly, the passivation layer 55 can be prevented from overhanging the waveguide opening 53.

Thus, the waveguide material layer 57 can favorably fill the waveguide opening 53 without forming voids.

Also, the shading can be reduced. More specifically, since the face S of the pad-coating insulating film 51 defining part of the waveguide opening 53 is slanted so as to diverge toward the open side, oblique light, which is generally rejected, can partially enter the photoelectric conversion portion 21.

Consequently, the quantity of light the photoelectric conversion portion 21 can receive is increased, and accordingly the sensitivity is enhanced.

In addition, the thickness of the pad-coating insulating film 51 is in the range of 50 to 250 nm, and is thus smaller than that of the pad-coating insulating film according to the related art.

Also, since the portion of the uppermost insulating interlayer 48 not having the metal pad 49 has a thickness d2 smaller than the thickness d1 of the portion of the insulating interlayer 48 under the metal pad 49, the thickness of the insulating interlayer can be reduced more than that of the related art.

Alternatively, the uppermost insulating interlayer 48 may be formed only under the metal pad 49. In this instance, the total thickness of the insulating interlayers in the region in which the waveguide opening 53 is formed can be smaller than that according to the rerated art. Accordingly, the optical path through which incident light reaches the photoelectric conversion portion 21 can be reduced, and consequently, the sensitivity can be increased.

The optical path through which incident light reaches the photoelectric conversion portion 21 can be reduced through the above-described approaches, and consequently, the sensitivity can be enhanced.

The optical waveguide 59 may be formed deeper according to the decrease in thickness of the pad-coating insulating film 51 or the uppermost insulating interlayer 48 in which the optical waveguide 59 is formed.

Accordingly, the characteristics of the optical waveguide are improved, and thus the quantity of light the photoelectric conversion portion 21 can receive is increased. Consequently, the sensitivity can be increased.

In addition, since the portion of the uppermost insulating interlayer 48 under the metal pad 49 has a thickness d1 of 550 nm or more, it has a sufficient bonding resistance to a bonding wire (not shown) formed on the metal pad 49. Hence, leakage current does not occur.

Furthermore, the presence of the pad-coating insulating film 51 allows a resist layer acting as an etching mask for forming the waveguide opening 53 to be formed thin. For example, the resist layer can be formed to a thickness of 1.5 µm or less.

Thus, the exposure margin can be increased.

Also, since the metal pad 49 is protected by the resist layer and the pad-coating insulating film 51 from etching for forming the waveguide opening 53, the metal pad 49 is not etched or deteriorated.

Thus, the reliability of the metal pad 49 can be maintained.

The lower portion of the first isolation portion 14 can be buried in the semiconductor substrate 11 to reduce the height of the first isolation portion 14 protruding from the surface of the semiconductor substrate 11. For example, the height of the protrusion is reduced to 40 nm or less to minimize the negative effect of the bump.

Consequently, the flatness at the surface of the insulating film 31 is enhanced.

By forming the pad-coating insulating film 51 or the uppermost insulating interlayer 48 having the above structure on the surface of the insulating film 31 whose flatness is thus enhanced, the aspect ratio of the waveguide opening 53 can further be reduced, and consequently, the sensitivity of the resulting solid-state imaging device 1 (1B) can further be enhanced.

Even if the protrusion of the first isolation portion 14 is larger than the above-mentioned value, the waveguide opening 53 can be easily formed by reducing the thickness of the pad-coating insulating film 51. Hence, the margin for filling the waveguide opening 53 can be increased.

In the solid-state imaging device 1B according to the second embodiment, the pad-coating insulating film 51 may be formed to the same thickness as in the related art while the portion of the uppermost insulating interlayer 48 not having the metal pad 49 is formed to a smaller thickness than the portion of the insulating interlayer 48 under the metal pad 49. The light-receiving sensitivity in this structure is not enhanced more than that in the structure having the pad-coating insulating film 51 of 50 to 250 nm in thickness, but can be enhanced more than that of the related art.

Third Embodiment
Method for Manufacturing a Solid-state Imaging Device

A method for manufacturing a solid-state imaging device according to a third embodiment will now be described with reference to the schematic sectional views shown in FIGS. 5 and 6.

Figure 5:
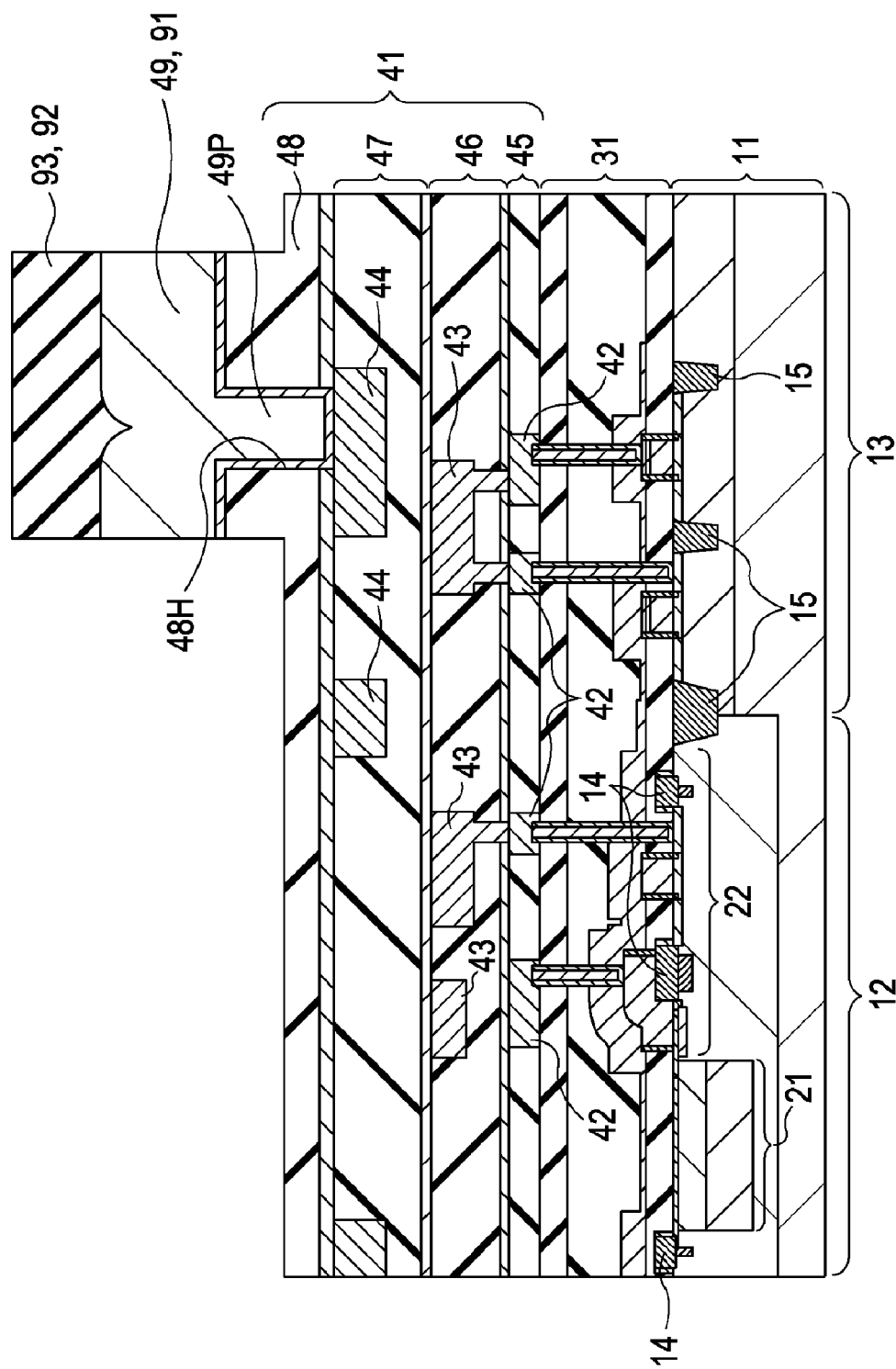
FIG. 5 is a schematic sectional view showing a method for manufacturing a solid-state imaging device according to an embodiment of the present invention.

As shown in FIG. 5, a pixel region 12 and a peripheral circuit region 13 around the pixel region 12 are formed in a semiconductor substrate 11. The pixel region 12 includes a photoelectric conversion portion 21 that produces electrical signals by photoelectric conversion of incident light.

In addition to the photoelectric conversion portion 21, the pixel region 12 is provided therein with a pixel transistor portion 22 converting the signal charge read from the photoelectric conversion portion 21 into a voltage, and a first isolation portion 14 separating the photoelectric conversion portion 21 from the pixel transistor portion 22. The first isolation portion 14 has an STI (Shallow Trench Isolation) structure and, for example, protrudes from the surface of the semiconductor substrate 11.

A second isolation portion 15 having an STI structure is also formed in the peripheral circuit region 13 of the semiconductor substrate 11.

The first isolation portion 14 is partially buried in the semiconductor substrate 11 to a smaller depth than the second isolation portion 15. For example, part of the first isolation portion 14 is buried in the semiconductor substrate 11 to a depth in the range of 50 to 160 nm. Part of the second isolation portion 15 is buried in the semiconductor substrate 11 to a depth in the range of, for example, 200 to 300 nm.

By reducing the depth of the buried portion of the first isolation portion 14 in the pixel region 12, etching damage to and film stress on the STI structure can be reduced. By setting the depth of the buried portion in the above range, white spots and dark current can be reduced, which is important to the imaging characteristics of the pixel region 12.

In addition, by burying the second isolation portion 15 of the peripheral circuit region 13 deeper than the first isolation portion 14, the isolation withstand voltage can be increased. One of the important factors for the peripheral circuit region 13 is high-speed operation. By increasing the depth of the buried portion, the parasitic capacitance of the conductor line can be reduced, and consequently, a high-speed device can be achieved.

By varying the depth of the STI structure between the pixel region 12 and the peripheral circuit region 13, a high-performance solid-state imaging device 1 (1B) can be achieved.

The semiconductor substrate 11 is covered with an insulating layer 31 including, for example, an antireflection layer and a planarizing layer. The uppermost layer of the insulating layer 31 may be a planarizing layer, and a wiring portion 41 is formed on the uppermost layer. The wiring portion 41 includes a plurality of wiring layers defined by respective conductor lines 42, 43 and 44, and insulating interlayers 45, 46, 47 and 48 filling the spaces between the wiring layers and between the conductor lines.

For example, the insulating interlayers 45 to 48 are formed of silicon oxide, and the uppermost insulating interlayer 48 is formed to a thickness of 550 to 1120 nm, and more preferably 550 to 650 nm. This range of the thickness of the uppermost insulating interlayer 48 is set so as to impart a sufficient resistance to the insulating interlayer 48, as described above.

If the metal layer of the metal pad 49 is intended for only a metal pad, it is advantageous to form the meta pad 49 to a larger thickness, for example, 1120 nm.

In the present embodiment, however, the metal layer of the metal pad 49 also serves as a wiring layer. Since the bonding resistance increases as the thickness is increased, the metal pad 49 can be formed to a thickness of 600 nm or more. On the other hand, from the viewpoint of reducing the step height that may cause other layers, such as color filters, to be formed unevenly, it is advantageous that the metal pad 49 is formed to a thickness of 650 nm or less.

Subsequently, a metal pad 49 is formed on the uppermost insulating interlayer 48 of the wiring portion 41 and is connected to the conductor line 44.

For forming the metal pad 49, first, a connection hole 48H communicating with the conductor line 44 is formed in the uppermost insulating interlayer 48.

Then, an electroconductive layer 91 is formed on the uppermost insulating interlayer 48 so as to be connected to the conductor line 44 through the connection hole 48H. The electroconductive layer 91 is formed of, for example, aluminum or an aluminum alloy, and has a thickness in the range of, for example, 600 to 1120 nm, and more preferably 600 to 650 nm.

If the metal layer of the metal pad 49 is intended for only a metal pad, it is advantageous to form the meta pad 49 to a larger thickness, for example, 1120 nm.

In the present embodiment, however, the metal layer of the metal pad 49 also serves as a wiring layer. Since the bonding resistance increases as the thickness is increased, the metal pad 49 can be formed to a thickness of 600 nm or more. On the other hand, from the viewpoint of reducing the step height that may cause other layers, such as color filters, to be formed unevenly, it is advantageous that the metal pad 49 is formed to a thickness of 650 nm or less.

An adhesion layer or a barrier metal layer may be forms before forming the electroconductive layer 91. Such layers include a titanium layer, a titanium nitride layer, a tantalum layer or a tantalum nitride layer.

A hard mask layer 92 is further formed on the electroconductive layer 91. The hard mask layer 92 is, for example, an inorganic insulating film. The inorganic insulating film may be formed of, for example, silicon oxide or silicon nitride. When the hard mask layer 92 is a silicon oxide, the thickness is set in the range of 100 to 550 nm so as to function as an etching mask.

Subsequently, a resist mask (not shown) for forming a metal pad is formed of a resist on the hard mask layer 92, and a hard mask 93 is formed from the hard mask layer 92 by etching (for example, dry etching). Then, the resist mask is removed.

The electroconductive layer 91 is patterned into a metal pad 49 using the hard mask 92 as an etching mask.

Furthermore, the uppermost insulating interlayer 48 is etched using the hard mask 93 as an etching mask. The portion of the uppermost insulating interlayer 48 under the metal pad 49 is left without being etched while the portion of the uppermost insulating interlayer 48 not having the metal pad 49 is etched. The etching is performed until the thickness of the etched portion of the uppermost insulating interlayer 48 is reduced to 350 nm or less.

For etching the electroconductive layer 91, a chlorine-based etching gas generally used for dry etching of aluminum or aluminum alloy films can be used as etching gas. For etching the uppermost insulating interlayer 48, a chlorofluorocarbon-based etching gas generally used for dry etching of silicon oxide films can be used as etching gas.

The dry etching of the electroconductive layer 91 does not etch the insulating interlayer 48. Even if, for example, over etching is excessively performed, a step having a height of 200 nm or more is not formed in the uppermost insulating interlayer 48. The feature of the present embodiment is that the uppermost insulating interlayer is etched on purpose.

Thus, the portion of the uppermost insulating interlayer 48 not having the metal pad 49 can be formed to a smaller thickness than the portion of the insulating interlayer 48 under the metal pad 49.

For example, the portion of the uppermost insulating interlayer 48 under the metal pad 49 has a thickness of 550 to 600 nm while the portion of the insulating interlayer 48 not having the metal pad 49 has a thickness of 350 nm or less.

Alternatively, the portion of the uppermost insulating interlayer 48 not having the metal pad 49 may be completely removed.

The metal pad 49 connected to the conductor line 44 of the wiring portion 41 is thus formed on the upper surface of the uppermost insulating interlayer 48. In this instance, the portion of the electroconductive layer filling the connection hole 48H acts as a plug 49P.

The plug 49P and the metal pad 49 may be formed in different steps. In other words, the plug 49P may be formed first, and then the metal pad 49 may be formed.

FIG. 5 shows the state after the uppermost insulating interlayer 48 has been etched.

Figure 6:
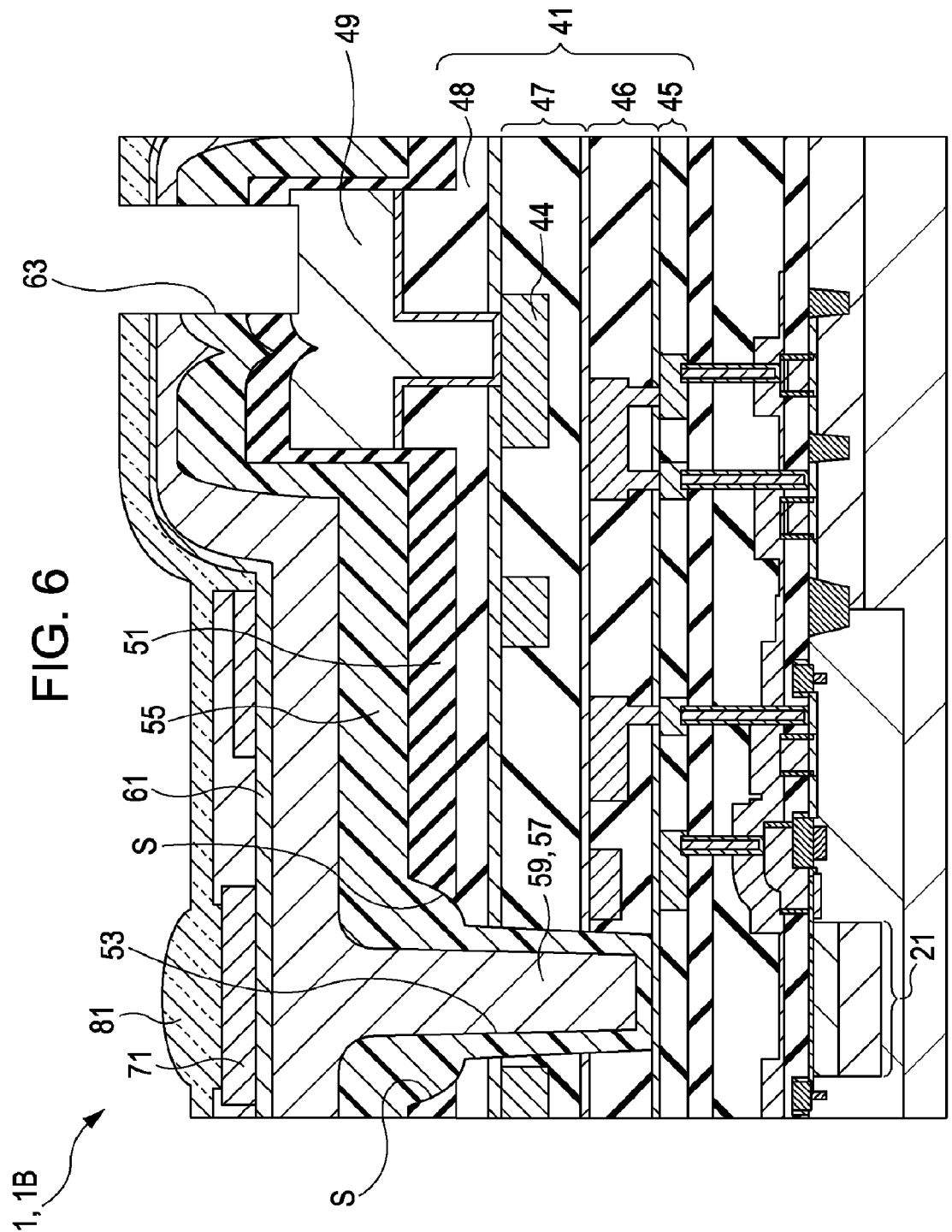
FIG. 6 is a schematic sectional view showing the method for manufacturing a solid-state imaging device.

Turning now to FIG. 6, a pad-coating insulating film 51 covering the metal pad 49 is formed on the wiring portion 41. The pad-coating insulating film 51 is formed of, for example, silicon oxide to a thickness in the range of 50 to 250 nm. Alternatively, the pad-coating insulating film 51 may be a composite film including at least two layers made of silicon oxide, silicon oxynitride or silicon nitride. Such a pad-coating insulating film 51 is also formed to a thickness in the range of 50 to 250 nm.

The reason why the thickness of the pad-coating insulating film 51 is set in the range of 50 to 250 nm is the same as described in the first embodiment.

Subsequently, a resist mask (not shown) is formed by a conventional lithography, and a waveguide opening 53 is formed in the insulating interlayers 45 to 48 over the photoelectric conversion portion by etching through the resist mask. If the pad-coating insulating film 51 and the uppermost insulating interlayer 48 are made of different materials, the waveguide opening 53 is formed first, and then the pad-coating insulating film 51 is isotropically etched so that the face S defining part of the waveguide opening 53 is slanted to diverge toward the open side.

If the pad-coating insulating film 51 and the uppermost insulating interlayer 48 are made of the same material, the waveguide opening 53 is first formed only in the pad-coating insulating film 51, and pad-coating insulating film 51 is isotropically etched so that the face S defining part of the waveguide opening 53 is slanted to diverge toward the open side. Then, the waveguide opening 53 is extended to be formed in the insulating interlayers 48 to 45.

Subsequently, the resist mask is removed.

Then, a waveguide material layer 57 is formed in the waveguide opening 53 and on the pad-coating insulating film 51 with a passivation layer 55 therebetween.

An optical waveguide 59 is thus formed by filling the waveguide-opening 53 with the waveguide material layer 57 with the passivation layer 55 therebetween.

A color filter 71 and a condensing lens 81 are further formed on the optical waveguide 59 with a planarizing layer 61 therebetween. In addition, an opening 63 is formed in a region on the metal pad 49.

A solid-state imaging device 1 (1B) is thus completed.

When the waveguide opening 53 is formed in the method according to the present embodiment, the face S of the pad-coating insulating film 51 defining part of the waveguide opening 53 is slanted so as to diverge toward the open side. Thus, the passivation layer 55 can be prevented from overhanging the waveguide opening 53.

Consequently, the waveguide material layer 57 can favorably fill the waveguide opening 53 without forming voids.

Since the face S of the pad-coating insulating film 51 defining part of the waveguide opening 53 is slanted so as to diverge toward the open side, part of the oblique light, which is generally rejected, can enter the photoelectric conversion portion 21. Thus, the quantity of light the photoelectric conversion portion 21 can receive is increased as well the shading is reduced, and accordingly the sensitivity is enhanced.

In the method according to the present embodiment, also, the uppermost insulating interlayer 48 other than the portion under the metal pad 49 is etched to reduce the thickness, or to be removed completely. Accordingly, the optical path through which incident light reaches the photoelectric conversion portion 21 can be reduced, and consequently, the sensitivity can be enhanced.

Alternatively, the optical waveguide 59 may be formed deeper according to the decrease in thickness of the uppermost insulating interlayer 48. Accordingly, the characteristics of the optical waveguide can be improved, and the quantity of light the photoelectric conversion portion can receive can be increased. Consequently, the sensitivity can be increased.

In the method according to the present embodiment, the metal pad 49 is patterned by etching using a hard mask process so that the portion of the uppermost insulating interlayer 48 not having the metal pad 49 is self-aligned. This technique does not require an additional etching mask. Thus, the manufacturing process can be simplified.

In the method according to the present embodiment, the pad-coating insulating film 51 may be formed to the same thickness as in the related art while the portion of the uppermost insulating interlayer 48 not having the metal pad 49 is formed to a smaller thickness than the portion of the insulating interlayer 48 under the metal pad 49. The light-receiving sensitivity in this structure is not enhanced more than that in the structure having the pad-coating insulating film 51 of 50 to 250 nm in thickness, but can be enhanced more than that of the related art.

Fourth Embodiment

Imaging Apparatus

An imaging apparatus according to a fourth embodiment of the present invention will now be described with reference to the block diagram shown in FIG. 7. The imaging apparatus includes a solid-state imaging device according to an embodiment of the present invention.

Figure 7:
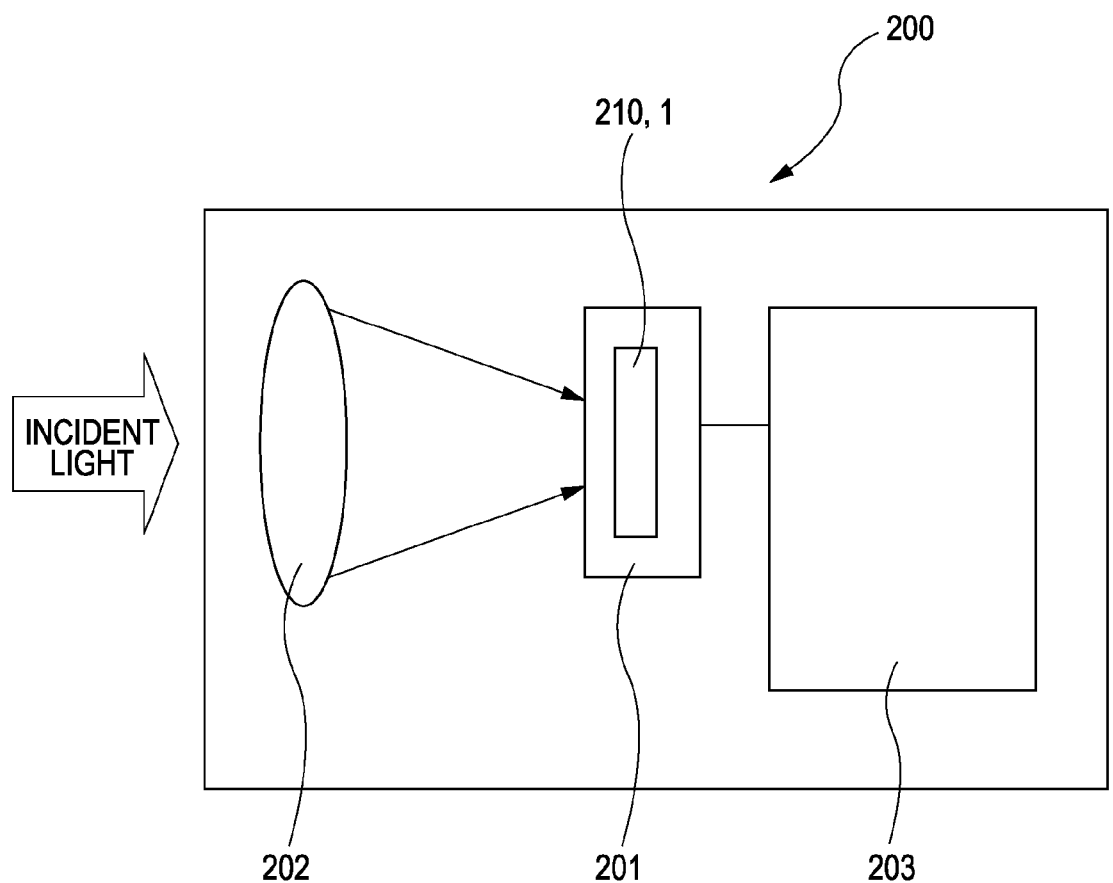
FIG. 7 is a block diagram of an imaging apparatus according to an embodiment of the present invention.
Figure 8:
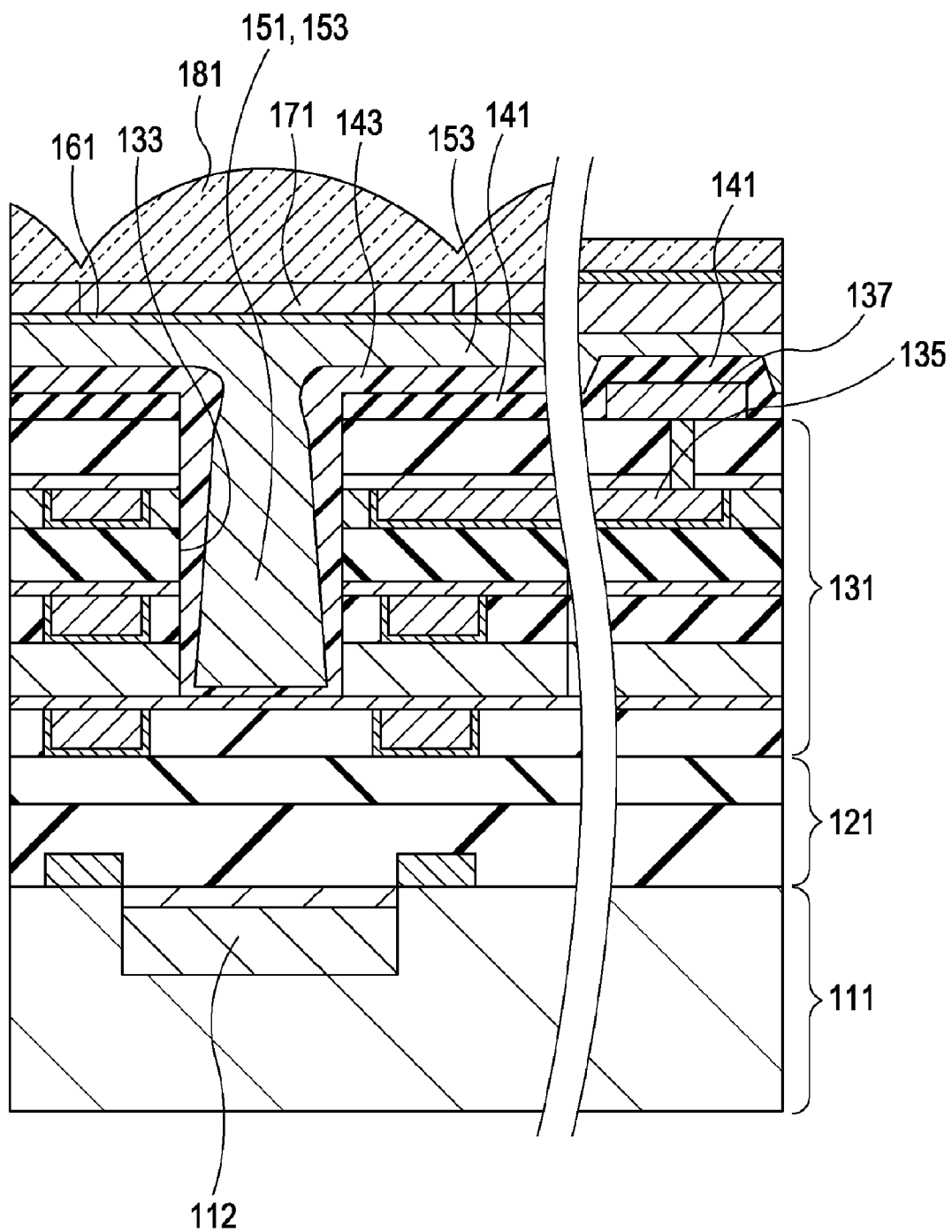
FIG. 8 is a schematic sectional view of a solid-state imaging device according to the related art.

As shown in FIG. 7, the imaging apparatus 200 includes an imaging section 201 including the solid-state imaging device 210. An image-forming optical system 202 is disposed to the light-focusing side of the imaging section 201. The imaging section 201 is connected to a drive circuit that drives the imaging section 201, and a signal processing section 203 including a signal processing circuit that processes into an image a signal produced by photoelectric conversion in the solid-state imaging device 210. The image signal processed by the signal processing section 203 can be stored in an image memory section (not shown). The solid-state imaging device 1A or 1B as described in the above embodiments may be used as the solid-state imaging device 210 of the imaging apparatus 200.

The imaging apparatus 200 including a solid-state imaging device according to an embodiment of the invention can ensure a sufficient sensitivity in the photoelectric conversion portion of each pixel, as describe in the above embodiments. Consequently, pixel properties, for example, sensitivity, can be advantageously enhanced. In addition, the shading can be reduced, and accordingly, the resolution is increased around the pixels. Thus, the image quality can be enhanced.

The present invention can be applied to any imaging apparatus including a solid-state imaging device without limiting to the imaging apparatus having the above-described structure.

In one version, for example, the imaging apparatus 200 may be in a one-chip form or in a module form having an imaging function including an imaging section, a signal processing section and an optical system in a package.

Such imaging apparatuses include cameras and portable apparatuses having an imaging function. The word "imaging" used herein refers to capturing an image for photography with a camera, and broadly includes detecting, for example, fingerprints.

The present application contains subject matter related to that disclosed in Japanese Priority Patent Application JP 2008-180103 filed in the Japan Patent Office on Jul. 10, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a semiconductor substrate having a pixel region including a photoelectric conversion portion that produces an electrical signal by photoelectric conversion of incident light and a peripheral circuit region around the pixel region;
a wiring portion including a conductor line, the wiring portion disposed on the semiconductor substrate with an insulating film therebetween, the wiring portion having an opening therein over the photoelectric conversion portion;
a metal pad connected to the conductor line;
a pad-coating insulating film coating the metal pad, the pad-coating insulating film having an opening over the photoelectric conversion portion, the opening defined by a face and the opening thereof continuing from the opening of the wiring portion to define a waveguide opening having an open side and a closed side; and
a waveguide material layer disposed in the waveguide opening and on the pad-coating insulating film with a passivation layer therebetween,
wherein,
the pad-coating insulating film has a thickness in the range of 50 to 250 nm, and the face of the pad-coating insualting film defining the opening is slanted so as to diverge toward the open side of the waveguide opening.

2. The solid-state imaging device according to claim 1, wherein the pixel region includes:
a pixel transistor portion converting a signal charge read from the photoelectric conversion portion into a voltage, and
a first isolation portion having a shallow trench isolation structure and isolating the photoelectric conversion portion from the pixel transistor portion, the first isolation portion being partially buried in the semiconductor substrate, and
the peripheral circuit region includes a second isolation portion having a shallow trench isolation structure and partially buried in the semiconductor substrate, and the portion of the first isolation portion buried in the semiconductor substrate has a smaller depth than the portion of the second isolation portion buried in the semiconductor substrate.

3. A solid-state imaging device comprising:
a semiconductor substrate having a pixel region including a photoelectric conversion portion that produces an electrical signal by photoelectric conversion of incident light and a peripheral circuit region around the pixel region;
a wiring portion including a plurality of insulating interlayers having a plurality of conductor lines, the wiring portion being disposed on the semiconductor substrate with an insulating film therebetween, the wiring portion having an opening therein over the photoelectric conversion portion;
a metal pad disposed on the uppermost layer of the plurality of insulating interlayers and connected to one of the plurality of conductor lines;
a pad-coating insulating film coating the metal pad, the pad-coating insulating film having an opening therein over the photoelectric conversion portion, the opening defined by a face and the opening thereof continuing from the opening of the wiring portion to define a waveguide opening having an open side and a closed side; and
a waveguide material layer disposed in the waveguide opening and on the pad-coating insulating film with a passivation layer therebetween,
wherein,
the uppermost insulating interlayer has a portion on which the metal pad is disposed and a portion not having the metal pad, and the portion not having the metal pad has a smaller thickness than the portion under the metal pad, and wherein the face of the pad-coating insulating film defining the opening is slanted so as to diverge toward the open side of the waveguide opening.

4. The solid-state imaging device according to claim 1, wherein the wiring portion includes a plurality of insulating interlayers having a plurality of conductor lines including the conductor line connected to the metal pad, and wherein the uppermost layer of the plurality of insulating interlayers has a portion on which the metal pad is disposed and a portion not having the metal pad, and the portion not having the metal pad has a smaller thickness than the portion under the metal pad.

5. A solid-state imaging device comprising:
a semiconductor substrate having a pixel region including a photoelectric conversion portion that produces an electrical signal by photoelectric conversion of incident light and a peripheral circuit region around the pixel region;
a wiring portion including a plurality of insulating interlayers having a plurality of conductor lines, the wiring portion being disposed on the semiconductor substrate with an insulating film therebetween, the wiring portion having an opening therein over the photoelectric conversion portion;
a metal pad disposed on the uppermost layer of the plurality of insulating interlayers and connected to one of the plurality of conductor lines, the uppermost insulating interlayer being present only under the metal pad;
a pad-coating insulating film coating the metal pad, the pad-coating insulating film having an opening therein over the photoelectric conversion portion, the opening defined by a face and the opening thereof continuing from the opening of the wiring portion to define a waveguide opening having an open side and a closed side; and
a waveguide material layer disposed in the waveguide opening and on the pad-coating insulating film with a passivation layer therebetween,
wherein,
the face of the pad-coating insulating film defining the opening is slanted so as to diverge toward the open side of the waveguide opening.

6. The solid-state imaging device according to claim 1, wherein the wiring portion includes a plurality of insulating interlayers having a plurality of conductor lines including the conductor line connected to the metal pad, and the uppermost layer of the plurality of insulating interlayers is present only under the metal pad.

7. A method for manufacturing a solid-state imaging device, comprising the steps of:
forming a pixel region and a peripheral circuit portion around the pixel region, in a semiconductor substrate, the pixel region including a photoelectric conversion portion that produces an electrical signal by photoelectric conversion of incident light;
forming a wiring portion on the semiconductor substrate with an insulating film therebetween, the wiring portion including a plurality of insulating interlayers having a plurality of conductor lines;
forming a metal pad connected to one of the plurality of conductor lines on the uppermost layer of the insulating interlayers of the wiring portion;
forming a pad-coating insulating film coating the metal pad on the wiring portion; and
forming a waveguide opening having an open side and a closed side in the insulating interlayers and the pad-coating insulating film over the photoelectric conversion portion such that the opening in the pad-coating insulating film has a face slated so as to diverge toward the open side of the waveguide opening,
wherein,
the step of forming the metal pad includes the sub steps of:
forming a connection hole in the uppermost layer of the insulating interlayers so as to communicate with one of the conductor lines under the uppermost insulating interlayer, forming a metal-based electroconductive layer on the uppermost insulating interlayer so as to fill the connection hole,
patterning the electroconductive layer to form a plug in the connection hole and the metal pad connected to the plug, and
etching the uppermost insulating interlayer so as to reduce the thickness of the uppermost insulating interlayer around the metal pad or substantially completely removing the uppermost insulating interlayer around the metal pad, leaving the portion of the uppermost insulating interlayer under the metal pad.

8. An imaging apparatus comprising:
a light-focussing optical system focussing incident light;
a solid-state imaging device receiving the light focussed by the light-focussing optical system and photoelectrically converting the light into a signal; and
a signal processing section processing the converted signal,
wherein,
the solid-state imaging device includes:
a semiconductor substrate having a pixel region including a photoelectric conversion portion that produces an electrical signal by photoelectric conversion of incident light and a peripheral circuit region around the pixel region,
a wiring portion including a conductor line, the wiring portion disposed on the semiconductor substrate with an insulating film therebetween, the wiring portion having an opening therein over the photoelectric conversion portion; a metal pad connected to the conductor line,
a pad-coating insulating film coating the metal pad, the pad-coating insulating film having an opening therein over the photoelectric conversion portion, the opening thereof continuing from the opening of the wiring portion to define a waveguide opening having an open side and a closed side,
a waveguide material layer disposed in the waveguide opening and on the pad-coating insulating film with a passivation layer therebetween, and
the pad-coating insulating film has a thickness in the range of 50 to 250 nm and a face defining the opening therein, and the face is slanted so as to diverge toward the open side of the waveguide opening.

* * * * *

UNITED STATES PATENT AND TRADEMARK OFFICE
CERTIFICATE OF CORRECTION

PATENT NO. : 8,189,083 B2
APPLICATION NO. : 12/496963
DATED : May 29, 2012
INVENTOR(S) : Masahi Nakata et al.

Page 1 of 1

It is certified that error appears in the above-identified patent and that said Letters Patent is hereby corrected as shown below:

On the Title page of the patent:

(75) "Yasuhiro Nakana"

should be

(75) --Yasuhiro Nakano--

Signed and Sealed this
Twenty-eighth Day of August, 2012

David J. Kappos
*Director of the United States Patent and Trademark Office*